United States Patent

Sarma et al.

[11] Patent Number: 5,803,343
[45] Date of Patent: Sep. 8, 1998

[54] SOLDER PROCESS FOR ENHANCING RELIABILITY OF MULTILAYER HYBRID CIRCUITS

[75] Inventors: Dwadasi Hare Rama Sarma; Christine Ann Paszkiet, both of Kokomo; James Catlin Orem, Mc Cordsville, all of Ind.; Christopher Roderick Needes, Chapel Hill, N.C.

[73] Assignee: Delco Electronics Corp., Kokomo, Ind.

[21] Appl. No.: 550,321

[22] Filed: Oct. 30, 1995

[51] Int. Cl.⁶ ..................................... H05K 3/34
[52] U.S. Cl. .................. 228/180.21; 228/254; 29/846; 427/96
[58] Field of Search .............. 228/180.21, 180.22, 228/233.2, 253, 254, 193; 29/846; 427/96

[56] References Cited

U.S. PATENT DOCUMENTS

| | | | |
|---|---|---|---|
| 3,392,442 | 7/1968 | Napier et al. | 29/628 |
| 4,739,917 | 4/1988 | Baker | 228/123 |
| 5,372,295 | 12/1994 | Abe et al. | 228/180.22 |
| 5,390,080 | 2/1995 | Melton et al. | 361/765 |
| 5,452,842 | 9/1995 | Melton et al. | 228/180.22 |
| 5,463,191 | 10/1995 | Bell et al. | 174/263 |
| 5,470,787 | 11/1995 | Greer | 437/183 |
| 5,609,287 | 3/1997 | Izuta et al. | 228/123.1 |

*Primary Examiner*—Samuel M. Heinrich
*Attorney, Agent, or Firm*—Mark A. Navarre

[57] ABSTRACT

A thick film hybrid multilayer circuit characterized by circuit components that are electrically interconnected with a multilayer structure composed of multiple layers of conductors interlaid with layers of a dielectric material in order to achieve high component density. The circuit components of the hybrid circuit are bonded to the multilayer structure with a novel soldering technique employing multiple solder compositions, which reduces the occurrence of dielectric fatigue cracking from thermal cycling. As a result, the multilayer structure exhibits significantly enhanced thermal fatigue resistance.

7 Claims, 1 Drawing Sheet

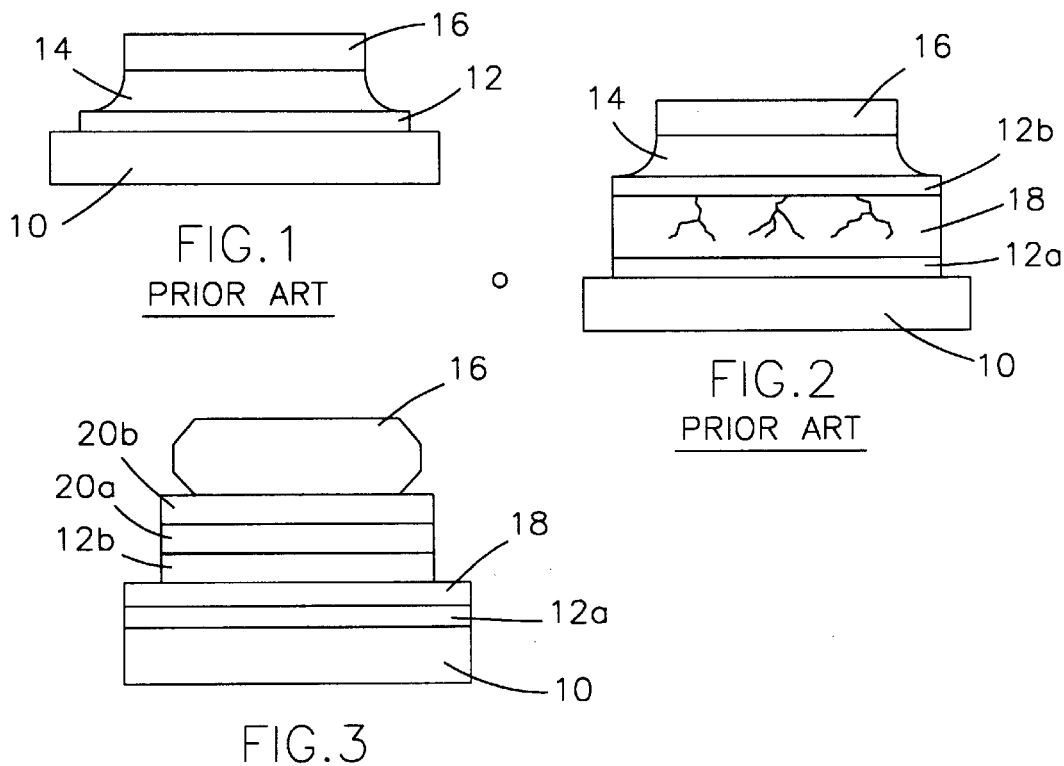
FIG. 1 PRIOR ART
FIG. 2 PRIOR ART
FIG. 3
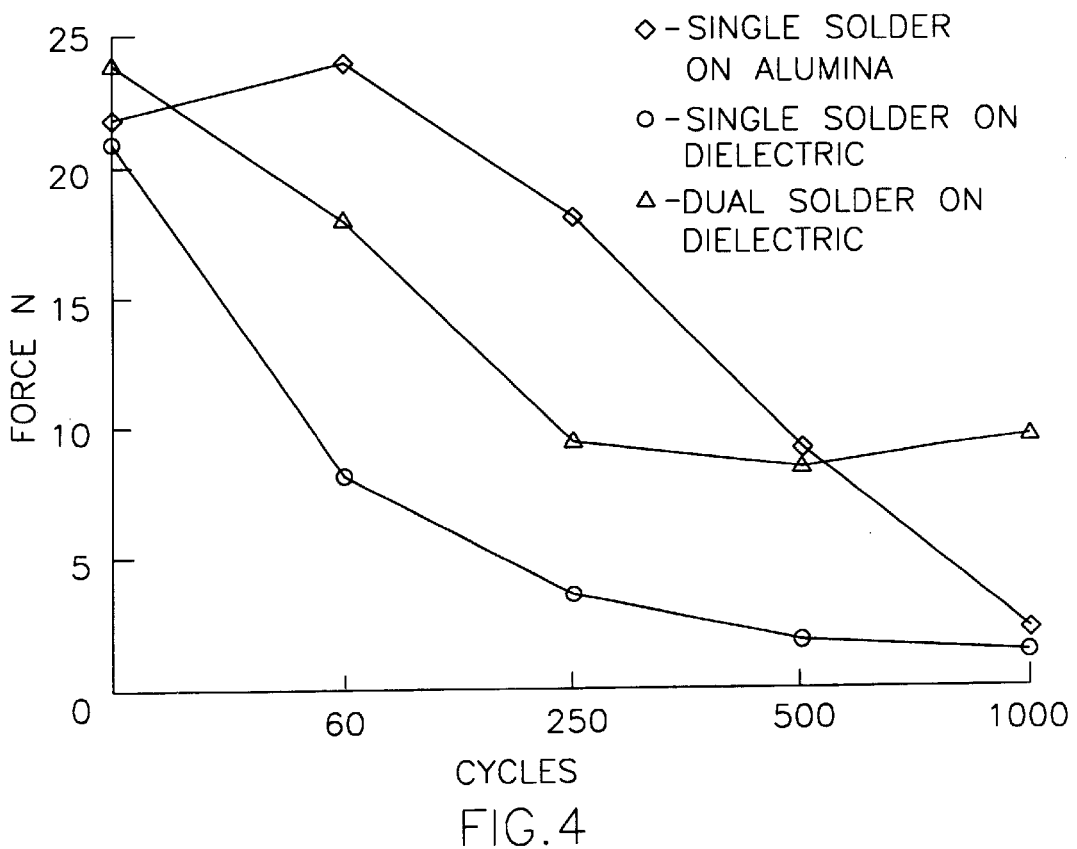
◇ – SINGLE SOLDER ON ALUMINA
○ – SINGLE SOLDER ON DIELECTRIC
△ – DUAL SOLDER ON DIELECTRIC
FIG. 4

SOLDER PROCESS FOR ENHANCING RELIABILITY OF MULTILAYER HYBRID CIRCUITS

The present invention generally relates to hybrid multilayer circuits in which circuit devices are electrically interconnected with a multilayer structure composed of multiple conductor layers interlaid with dielectric layers in order to achieve high component density. More particularly, this invention relates to thick film hybrid multilayer circuits having circuit devices mounted over a dielectric layer, wherein a dual solder process is employed to enhance the thermal-cycle performance of such circuits by reducing thermal stresses in the dielectric layer.

BACKGROUND OF THE INVENTION

In the prior art, thick film hybrid circuits have often had the construction shown in FIG. 1, in which a conductor 12 is formed on an alumina substrate 10 and a circuit component 16 is electrically and mechanically connected directly to the conductor 12 with a suitable solder or adhesive 14. When properly processed, such hybrid circuits will generally exhibit suitable thermal fatigue resistance, even though their construction is composed of dissimilar materials having different coefficients of thermal expansion. To achieve an acceptable level of thermal fatigue resistance, the materials for the conductor 12 and solder or adhesive 14 must be carefully selected in order to accommodate the disparate coefficients of thermal expansion of the alumina substrate 10 and the circuit component 16.

To a significant degree, the thermal fatigue resistance of a hybrid circuit having the construction shown in FIG. 1 is due to the circuit component 16 and conductor 12 being directly attached to a rugged substrate 10 formed from alumina or another substrate material. Consequently, the fatigue resistance of a hybrid circuit is altered considerably if the components are not directly mounted on an alumina substrate or other substrate material, but instead are mounted to some other hybrid circuit structure as depicted in FIG. 2. FIG. 2 illustrates a known method for achieving a higher component density for a thick film hybrid circuit, and therefore a reduced size for the circuit. The hybrid circuit of FIG. 2 uses multiple conductors 12a and 12b that are electrically interconnected with different circuit components 16. The conductors 12a and 12b are part of a multilayer structure composed of layers of metal runners forming the conductors 12a and 12b and interlaid with one or more layers of a dielectric material 18, all of which are supported by a substrate 10 formed from alumina or another suitable insulating substrate material. Successive layers of conductors 12a and 12b are electrically insulated from each other by the dielectric 18, with metallized holes or vias (not shown) being provided as required to electrically interconnect lower conductors, such as conductor 12a, with their respective circuit components at the surface of the multilayer structure. The component 16 is typically bonded to the conductor 12b with a solder, such as a tin-lead alloy, as is conventional in the industry.

While the above approach is highly desirable from the standpoint of maximizing component density, significant disadvantages exist. When using certain bonding technologies such as soldering, adhesion of the circuit components 16 to an exposed conductor 12b of the multilayer structure is not as reliable as directly attaching the component 16 to the alumina substrate 10. This is because solder constituents tend to diffuse into the conductor 12b, thereby affecting the mechanical properties of the structure and promoting cracking of the dielectric 18.

A shortcoming with hybrid multilayer circuits is the inherent structural weakness of the dielectric 18, particularly when subjected to stresses induced during thermal cycling of the hybrid circuit. The inferior mechanical properties of the dielectric 18 are generally due to its glassy nature and the manner in which the dielectric 18 is formed, which results in the presence of voids within the dielectric 18 that tend to promote crack propagation. Temperature excursions resulting from changes in the surrounding environment promote the formation of cracks through the dielectric 18, as illustrated in FIG. 2, as a result of the circuit components having different coefficients of thermal expansion. The resulting cracks have the potential for creating an electrical open within the hybrid circuit.

The prior art has sought to enhance thermal fatigue resistance of hybrid circuits by making improvements in the ink compositions that form the dielectric 18 and solder 14. While various improved solder compositions have become available, such compositions are generally not suitable for use with hybrid electronic circuitry due to their high processing temperatures, which have the potential for degrading the circuit components.

Accordingly, it would be desirable to further enhance the thermal-cycle fatigue resistance of a hybrid circuit that utilizes a multilayer conductor-dielectric structure. A suitable solution would be compatible with processing techniques employed in the industry, have minimal effect on the multilayer structure so as to maintain the component density achievable with hybrid multilayer circuits, and would also enable a reliable bond between circuit components and their conductors.

SUMMARY OF THE INVENTION

It is an object of this invention to provide a thick film hybrid circuit having a multilayer conductor-dielectric structure, and which exhibits enhanced thermal fatigue resistance as a result of a reduced tendency to form and propagate cracks in the dielectric layers of the multilayer structure.

It is another object of this invention that the circuit components of the hybrid circuit are electrically and physically connected to their respective conductors using a soldering technique that reduces the tendency for crack formation in the underlying dielectric layers of the multilayer structure.

It is a further object of this invention that the soldering technique entail the use of multiple solder compositions that are sequentially deposited, with the last deposited solder composition bonding to the circuit component of the hybrid circuit.

It is yet another object of this invention that the solder compositions have different liquidus temperatures, in which a solder composition having a relatively high liquidus temperature is deposited directly on a conductor, and the last deposited solder composition is characterized by a relatively lower liquidus temperature.

In accordance with a preferred embodiment of this invention, these and other objects and advantages are accomplished as follows.

According to the present invention, there is provided a thick film hybrid multilayer circuit characterized by circuit components that are electrically interconnected with and supported by a multilayer structure composed of multiple layers of conductors interlaid with layers of a dielectric material in order to achieve a high component density. The circuit components of the hybrid circuit are bonded to the multilayer structure through a novel soldering technique that employs multiple solder compositions, and which reduces the occurrence of dielectric fatigue cracking from thermal cycling. As a result, the multilayer structure, which is inherently more prone to thermally-induced cracking as compared to the substrate on which it is supported, exhibits significantly enhanced thermal fatigue resistance.

Generally, a hybrid multilayer circuit of this invention includes a multilayer structure supported on a surface of a substrate. The multilayer structure has at least one dielectric layer intermediate at least one pair of conductor layers, and a circuit component supported by the multilayer structure and electrically interconnected with one of the conductor layers. A solder joint serves to electrically interconnect and mechanically join the circuit component with a conductor layer. In accordance with this invention, the solder joint is composed of multiple solder layers, with a first solder layer overlaying the conductor layer to which the circuit component is electrically connected, and a second solder layer intermediate the first solder layer and the circuit component. The first and second solder layers are formed from different solder materials that are sequentially deposited and melted, or reflowed. The solder material for the second solder layer preferably has a liquidus temperature that is lower than that of the first solder layer, such that the first solder layer will not completely melt during the reflow of the second solder layer. More specifically, the first and second solder materials are each a tin-lead base alloy, with the first solder material having a lower tin content than the second solder material, resulting in a reduced tendency for the diffusion of tin into the underlying conductor and dielectric layers. In accordance with this invention, the diffusion of tin into the underlying layers from a solder causes the formation of intermetallic compounds that are both brittle and have coefficients of thermal expansion that are different from those prevailing in the rest of the circuit structure.

The above structure is produced by first forming the multilayer structure on the substrate in a conventional manner, and then forming the first solder layer by depositing and reflowing the solder material for the first solder layer over an exposed conductor layer to which a circuit component is to be attached. The solder material for the second solder layer is then deposited, the component is placed on the material, and the material is reflowed over the first solder layer. The circuit component is thus electrically and mechanically connected to the conductor layer. During reflow of the second solder material, the entire multilayer structure is heated to a temperature above the liquidus temperature of the second solder layer, but below that of the first solder layer.

The above structure and soldering technique have resulted in a multilayer structure that is less susceptible to the adverse effects caused by thermal excursions during the operation of the hybrid circuit, in that the dielectric layers within the multilayer structure are much less likely to crack when thermally cycled. Improvements in thermal fatigue resistance are achieved with this invention without necessitating structural or material modifications for the purpose of enhancing the reliability of the multilayer structure. As such, conventional multilayer structures can achieve improved fatigue resistance if modified to incorporate the multiple solder technique of the invention, even though the operating temperature extremes of the circuit components remain unchanged.

In view of the above, it can be seen that a significant advantage of the present invention is that it provides a solution to thermal fatigue cracking of the dielectric within a multilayer structure of a hybrid circuit, yet generally employs techniques that are compatible with other processes employed in the production of hybrid multilayer circuits. As a result, this invention can be readily implemented and hybrid multilayer circuits can be mass produced for use in such industries as the automotive industry. Furthermore, the present invention does not affect the multilayer structure of a hybrid multilayer circuit, so that desirable component densities remain achievable. Finally, the above benefits are realized with the use of solder compositions that yield a reliable bond between the circuit components and their conductors of a hybrid circuit.

Other objects and advantages of this invention will be better appreciated from the following detailed description.

BRIEF DESCRIPTION OF THE DRAWINGS

The above and other advantages of this invention will become more apparent from the following description taken in conjunction with he accompanying drawings, in which:

FIG. 1 shows, in cross-section, a prior art thick film hybrid circuit having a circuit component mounted directly on the circuit substrate;

FIG. 2 shows, in cross-section, a prior art thick film hybrid multilayer circuit having a circuit component mounted on a multilayer structure that includes a dielectric layer, in which cracks are present as a result of fatigue cracking from thermal cycling;

FIG. 3 shows, in cross-section, a thick film hybrid multilayer circuit employing a dual-composition solder joint in accordance with this invention; and FIG. 4 graphically represents an enhanced peel strength for the dual-composition solder joint of this invention as compared to prior art solder methods.

DETAILED DESCRIPTION OF THE INVENTION

A thick film hybrid multilayer circuit in accordance with this invention is shown in FIG. 3. The hybrid multilayer circuit is characterized by a circuit component 16 that is electrically interconnected with a multilayer structure composed of multiple layers of runners, or conductors 12a and 12b, interlaid with at least one layer of a dielectric 18, in order to achieve a high component density. As shown, the component 16 is electrically interconnected to a conductor 12b with dual solder layers 20a and 20b, in accordance with this invention. While the multilayer structure is shown as being composed of only one conductor-dielectric-conductor structure, those skilled in the art will recognize that numerous layers can be utilized, as may be necessitated by a particular application. Furthermore, the circuit component 16 represented in FIG. 3 can be any suitable surface mount device, such as a flip chip or chip-and-wire integrated circuit, or a capacitor, resistor or inductor.

As noted previously, hybrid multilayer circuits of the type shown in FIG. 2 are known to be particularly prone to thermal fatigue cracking of the dielectric 18 within its multilayer structure. Furthermore, it is known that large changes in ambient temperature in combination with significant differences in coefficients of thermal expansion are the basis for this phenomenon. However, in accordance with this invention, significant improvements in thermal fatigue resistance have been achieved without reducing component operating temperatures or the ambient temperature extremes of a hybrid multilayer circuit. Instead, such improvements have been achieved by modifying the soldering technique employed to bond the component 16 to the conductor 12b. More specifically, such improvements have been achieved when the circuit component 16 is directly mounted to the multilayer structure with multiple layers of solder, such as the two solders 20a and 20b shown in FIG. 3, if their compositions are selected such that the solder 20a adjacent the conductor layer 12b has a lower tin content than the solder 20b. As such, the solder layer 20a will be referred to as a low tin solder, while the solder layer 20b will be referred to as a high tin solder, though these terms refer only to the relative amounts of tin in the solders 20a and 20b, and not to the level of tin as compared to other solders containing tin. Preferably, the solders 20a and 20b also have different liquidus temperatures, with the solder 20a having a higher liquidus temperature than the solder 20b.

The beneficial effect of a dual solder bonding technique was determined through experimentations with various combinations of conductor and dielectric ink compositions. The experiments were performed specifically with the intent of overcoming the propensity for the dielectric layer of a hybrid multilayer circuit to crack during thermal cycling. Factors known to contribute to fracturing of the dielectric include the relative weakness of dielectric materials as compared to alumina and other known substrate materials, as well as the size and operating temperature of the circuit component, and the thermal conditions to which the circuit is exposed, including temperature extremes and the incidence of thermal cycles. The effects of the solder compositions used to bond a circuit component to its conductor had been investigated to the extent that low temperature solder compositions are used to maintain the solder reflow temperature at an acceptable level that will not damage the component.

While multiple solder combinations have found limited use in the prior art for bonding circuit components directly to alumina substrates, such uses were for achieving benefits unrelated to thermal-cycle fatigue of multilayer structures in which, as noted previously, a tendency exists for cracks to develop and propagate in the intermediate printed dielectric film. Moreover, thermal-cycle fatigue of the underlying substrate was not a problem with such prior uses because the circuit components are soldered directly to a conductor printed on a substrate, which is inherently stronger than the dielectric layer of a hybrid multilayer circuit. Accordingly, nothing in the prior art usage of multiple solder layers suggested the beneficial impact that dual solder layers might have on the thermal-cycle fatigue resistance of a multilayer circuit of the type represented in FIG. 2, such as by adopting the structure shown in FIG. 3.

In the course of the experimentation leading to this invention, various solder/conductor/dielectric combinations were evaluated to determine their effect, if any, on the thermal fatigue resistance of a hybrid multilayer circuit of the type shown in FIG. 2. The substrate employed throughout testing was alumina, which is a preferred substrate material for hybrid multilayer circuits. Conductors were formed from ink compositions available from E. I. DuPont de Nemours and Company, Inc., of Wilmington, Del., under the product designations QM21, QS170, QS179, 7484 and 7484F. The QS170 and QS179 compositions are based on silver-platinum alloys, while the 7484, 7484F and QM21 compositions are based on silver-palladium alloys. One practice is to form upper and lower conductors of a multilayer structure from different ink compositions in order to exploit their particular properties. For example, upper conductors (such as conductor 12b in FIG. 3) have been formed from an ink composition, such as the 7484F material, which yields a conductor that is readily solderable and solder leach-resistant, while lower conductors (such as conductor 12a in FIG. 3) might be formed from an ink composition, such as the QS170 or QS179 materials, which yields a conductor having a lower sheet resistance. Accordingly, for test specimens having a multilayer structure with a pair of conductors separated by a dielectric layer, the upper conductor soldered to the circuit component was the 7484, 7484F or QM21 composition, while the lower conductor bonded to the substrate was the QS170 or QS179 composition. However, for purposes of comparison, single conductor structures (such as that shown in FIG. 1) were also tested, in which the QS179, 7484 or 7484F composition was used to form a single conductor directly on the alumina substrate. In all cases, the conductors were deposited to a thickness of about eight to about twelve micrometers.

The dielectric materials tested during the course of the investigation were formed with ink compositions commercially available and widely employed in the art. The ink compositions tested are available from DuPont under the product designations QM42, 5704H and 5707, which were selected on the basis of electrical properties and processing compatibility with other thick film structures, such as conductors and resistors. In accordance with conventional practice, the inks were deposited in multiple layers in order to form a sufficiently thick dielectric layer, on the order of about thirty to about fifty micrometers. Two or three separate ink layers were successively deposited, dried and fired to form the dielectric of the multilayer structures tested.

Finally, the solders employed during the course of the testing were tin-lead alloy solders of the type used for a wide variety of soldering applications. Specifically, the solders were 60Sn-40Pb and 25Sn-75Pb alloys, with the solder alloy having the higher tin content being nearer the eutectic point, and therefore having a lower liquidus temperature than the high lead solder alloy. The 60Sn-40Pb solder was chosen on the basis of its desirable low reflow temperature and its traditional use in the industry, while the 25Sn-75Pb solder was chosen for its lower tin content, corresponding to a higher liquidus temperature and a reduced tendency for tin diffusion. While the 25Sn-75Pb solder generally has better mechanical properties than the 60Sn-40Pb solder, its use in electronic circuits has been severely limited by its high reflow temperature. Solder reflow techniques employed in the industry to attach circuit components of a hybrid circuit dictate that a relatively low temperature solder contact the component in order to avoid thermal damage to the component. Accordingly, where a single solder composition was tested, the solder composition used was the 60Sn-40Pb alloy, while the dual solder combination of the present invention was the 25Sn-75Pb alloy overlaid with the 60Sn-40Pb alloy. The 60Sn-40Pb solder was controlled to a thickness of about 80 to about 120 micrometers when used alone. In contrast, the dual solder combination employed an approximately 15 to 25 micrometers thick 25Sn-75Pb solder layer over which an approximately 80 to 120 micrometers thick 60Sn-40Pb solder layer was formed, though suitable ranges for these layers include a thickness of about 50 to about 150 micrometers for the 60Sn-40Pb solder and a thickness of about 5 to 50 micrometers for the 25Sn-75Pb solder. It was preferred to minimize the thickness of the 25Sn-75Pb solder layer in order to lessen any impact on additional processing.

One type of multilayer structure produced for the evaluation was fabricated by first depositing the appropriate conductor ink composition on the substrate to form the lower conductor, followed by drying and firing in a conventional manner. Each layer of the dielectric was then deposited, dried and fired, followed by deposition, drying and firing of the ink composition for the upper conductor, again all in a conventional manner. For samples employing only a single solder layer, a wire lead was held in place across the upper conductor and the sample was dipped in the desired molten solder. On removing the sample, a quantity of solder froze on the conductor, holding the wire lead in place. In contrast, the samples employing the dual solder process of this invention were fabricated by screen-printing a thin layer of the 25Sn-75Pb alloy paste on the upper conductor, and then melting this layer using a suitable reflow profile. The 60Sn-40Pb alloy was then deposited in a manner similar to the single-solder samples. Using these samples, a standardized peel test was conducted to determine the force necessary to dislodge the wire leads from their respective substrate or multilayer structure, or otherwise fracture the substrate or multilayer structure, in order to evaluate component attachment strength.

FIG. 4 is a graph representing the results of peel tests performed at intervals throughout the course of thermal cycling, involving a two hour temperature cycle between −40° C. and 125° C. The test specimens used in the test were identical wire lead test components mounted to either an alumina substrate in a manner such as that illustrated in FIG. 1, or a multilayer structure processed to include a dielectric (composed of three dielectric layers) formed from the 5704H ink composition, with the resulting structure having the appearance of that shown in FIG. 2 or 3, depending on the soldering technique employed. For the reasons noted above, the specimens with a multilayer structure employed an upper conductor of the 7484 material and a lower conductor of the QS170 material, while the remaining specimens employed only the 7484 conductor material. Finally, the wire leads were either (1) soldered to a conductor-over-alumina substrate structure with the 60Sn-40Pb solder alloy ("Single solder on alumina"), or (2) soldered to a multilayer structure with the 60Sn-40Pb alloy ("Single solder on dielectric"), or (3) soldered to a multilayer structure with the dual solder combination of 60Sn-40Pb over 25Sn-75Pb ("Dual solder on dielectric"). The combinations tested are summarized below.

TABLE I

| Structure Element | Single Solder On Alumina | Single Solder On Dielectric | Dual Solder On Dielectric |
|---|---|---|---|
| Substrate | Alumina | Alumina | Alumina |
| Lower Conductor | — | QS170 | QS170 |
| Dielectric | — | 5704H | 5704H |
| Upper Conductor | 7484 | 7484 | 7484 |
| Solder | 60 Sn-40 Pb | 60 Sn-40 Pb | 60 Sn-40 Pb over 25 Sn-75 Pb |

The results shown in the graph indicate that initial bond strengths for all of the specimens were approximately equal, with the typical failure mode for the multilayer specimens being a result of cracks developing in the dielectric layers. Thereafter, bond strengths dropped until the bond strength for the dual solder on dielectric specimens stabilized, while the bond strengths for the other groups of specimens continued to drop. After 1000 cycles, the dual solder on dielectric specimens exhibited a much greater bond strength than either of the other groups of specimens, with the single solder on alumina specimens exhibiting only a slightly higher bond strength than the single solder on dielectric specimens.

The significantly improved peel strength exhibited by the dual solder on dielectric specimens was unexpected, as was the absence of dielectric cracking in those specimens. Particularly surprising was the plateau in bond strength for the dual solder on dielectric specimens, which is evident in FIG. 4 between the 250 and 1000 cycle intervals. In addition, the intermetallic layer that formed between the dual solder layers and their respective conductors is presumed to be significantly thinner than that which formed with the single solder on alumina specimens. Such a result would appear to be a basis for the improvements indicated in FIG. 4, including the superior performance of the dual solder on dielectric specimens above 500 cycles.

Reliability of the dual solder process of this invention was further evaluated with the use of a 1000 cycle thermal-cycle test, again involving a two hour temperature cycle between −40° C. and 125° C. At intervals during the test, the electrical resistances of the tested structures were determined. Table II below summarizes the structural combinations tested. For this phase of testing, the test specimens employed identical daisy chained packaged devices having discrete components, such as SO8, QUAD 28, DMX38 crystal, SOT 23 diode, tantalum capacitor, chip resistor and chip capacitor, that were mounted to either an alumina substrate in a manner such as that illustrated in FIG. 1, or a multilayer structure processed to include a dielectric, with the resulting structure having the appearance of that shown in FIG. 2 or 3, depending on the soldering technique employed. The single solder on substrate specimens employed an alumina substrate and conductors formed from either the QS179 or 7484F ink compositions. The specimens having a multilayer structure employed an upper conductor of the 7484F or QM21 material and a lower conductor of the QS179 material. The dielectric was again formed of three successively deposited dielectric layers, composed of either a single layer of the QM42 material followed by two layers of the 5707 material, or two layers of the QM42 material followed by a single layer of the 5707 material. Finally, the circuit components were either (1) soldered to a conductor-over-alumina substrate structure with the 60Sn-40Pb solder alloy, or (2) soldered to a multilayer structure with the 60Sn-40Pb alloy, or (3) soldered to a multilayer structure with the dual solder combination of 60Sn-40Pb over 25Sn-75Pb.

The above-described multilayer specimens were fabricated by first depositing the appropriate conductor ink composition on the substrate to form the lower conductor, followed by drying and firing in a conventional manner. Each layer of the dielectric was then deposited, dried and fired, followed by deposition, drying and firing of the ink composition for the upper conductor, again all in a conventional manner. For a single solder layer, a quantity of solder paste was printed on the upper conductor. The leads or terminals of a packaged device or discrete component were then placed in the solder paste, and the solder was melted using a conventional reflow technique. In contrast, the samples employing dual solder were fabricated by first depositing a thin layer of 25Sn-75Pb alloy paste and melting this layer using an appropriate reflow profile. A layer of 60Sn-40Pb solder paste was then deposited, after which the leads or terminals of a packaged device or discrete component were placed in the solder paste. The solder was then reflowed at an appropriate temperature. The peak reflow temperature for the 60Sn-40Pb solder was about 220° C., which was notably lower than the peak reflow temperature of about 280° C. for the 25Sn-75Pb solder.

TABLE II

| Structure | Dual Solder Element Dielectric | | Single Solder On Alumina On Dielectric | | Single Solder On |
|---|---|---|---|---|---|
| Substrate | Alumina | Alumina | Alumina | Alumina | Alumina |
| Lower Conductor | — | — | QS179 | QS179 | QS179 |
| Dielectric | — | — | QM42 + 2x5707 | 2xQM42 + 5707 | 2xQM42 + 5707 |
| Upper Conductor | 7484F | QS179 | 7484F | QM21 | QM21 |
| Solder | 60 Sn-40 Pb<br>60 Sn-40 Pb | | 60 Sn-40 Pb<br>60 Sn-40 Pb | | 60 Sn-40 Pb over 25 Sn-75 Pb |

The results of the above-described test indicated normal resistance levels for all specimens except for the single solder on dielectric specimens with the QM42/5707 dielectric combination, which exhibited high probe pad resistance. The high resistance levels suggested the presence of cracks in the upper conductors of the single solder on dielectric specimens, the occurrence of which is known to be attributable to a solder-conductor metallurgical interaction. The physical appearance of the solder joints following the test was good, other than the single solder on dielectric specimens with the QM42 dielectric/QM21 conductor combination. Accordingly, neither group of the single solder on dielectric specimens was deemed to have successfully passed this thermal-cycle test, while the single solder on alumina and the dual solder on dielectric specimens each performed well electrically.

Such a result was generally expected for the single solder on alumina specimens, in that the thermal stresses within such structures are borne with little deleterious effect by the relatively strong alumina substrate. The results from the single solder on dielectric specimens demonstrated that thermal stresses within those structures adversely affected the relatively weak printed dielectric. The detrimental effect of such stresses was apparently intensified by the formation of a thick intermetallic layer between the solder and the conductor as a result of tin diffusion. In contrast, multilayer samples fabricated with dual solder were less severely affected by the stresses of thermal cycling as a result of a thinner intermetallic layer being formed between the conductor and solder during reflow. The reduced amount of intermetallic formed, in conjunction with the correspondingly thicker layer of solder remaining, accommodated the strain due to thermal expansion mismatch, and therefore lowered the stress level through the printed dielectric down to the dielectric/alumina interface.

On the basis of the above tests, it was apparent that a multilayer structure incorporating a dual solder process, in accordance with this invention, resulted in a structure that was less susceptible to the adverse effects caused by thermal cycling. More specifically, the dielectric layers within a multilayer structure formed in accordance with this invention were much less likely to crack when thermally cycled, as evidenced by the peel test and electrical conductivity test reported above. The beneficial effects of using the dual solder combination of 60Sn-40Pb over 25Sn-75Pb employed in the above-reported tests were attributable, in part, to the solder compositions having different tin contents, with a reduced tendency for tin to diffuse into the underlying conductors being the result of the lower tin solder composition being interposed between the higher tin solder and the conductors.

An important aspect of this invention was that improvements in thermal fatigue resistance were achieved without any change in the chemistry of the dielectric material or modification of the multilayer structure. As such, conventional multilayer structures can achieve improved fatigue resistance if modified solely to incorporate the multiple solder technique of the invention, and such improvements can be achieved without first reducing the ambient and operating temperatures of the multilayer structure.

Furthermore, it can be seen that a significant advantage of the present invention is that it provides a solution to thermal fatigue cracking of the dielectric layer within a multilayer structure of a hybrid circuit, yet with processing techniques that are compatible with those conventionally employed in the industry. As a result, this invention can be readily implemented to mass produce hybrid multilayer circuits for use in such industries as the automotive industry. Advantageously, the present invention does not affect the multilayer structure of a hybrid multilayer circuit, nor the component densities achievable with such structures. Finally, the above benefits are realized with the use of solder compositions that yield a reliable bond between the circuit components and their conductors of a hybrid circuit.

While our invention has been described in terms of a preferred embodiment, other forms could be adopted by one skilled in the art—for example, by employing alternate processing techniques to deposit the various layers of the multilayer structure, or by employing solder alloy compositions other than those specifically tested, or by employing additional solder layers. Accordingly, the scope of our invention is to be limited only by the following claims.

The embodiments of the invention in which an exclusive property or privilege is claimed are defined as follows:

1. A method of forming a thick film hybrid multilayer circuit, the method comprising the steps of:

providing a substrate having a surface;

forming a thick film multilayer structure on said surface, said multilayer structure including a dielectric layer and a conductor layer supported on said dielectric layer;

depositing a first solder layer on a portion of said conductor layer, said first solder layer being formed of a first solder material;

depositing a second solder layer over said first solder layer, said second solder layer being formed of a second solder material having a higher tin content and a lower liquidus temperature than said first solder material, thereby to reduce diffusion of tin into said conductor layer, consequently reducing thermal stress in said dielectric layer and increasing its thermal-cycle life; and electrically and mechanically connecting a circuit component to said conductor layer with said first and second solder layers.

2. A method as recited in claim 1 wherein said first and second solder materials are each tin-lead base alloys.

3. A method as recited in claim 1 wherein said first solder layer is thinner than said second solder layer.

4. A method as recited in claim 1 wherein said first solder layer is deposited to a thickness of about 5 to about 50 micrometers and said second solder layer is deposited to a thickness of about 50 to about 150 micrometers.

5. A method as recited in claim 1 wherein said connecting step comprises a reflow solder technique.

6. A method as recited in claim 5 wherein said connecting step comprises heating said second solder layer to a temperature above the liquidus temperature of said second solder layer but below the liquidus temperature of said first solder layer.

7. A method as recited in claim 1 wherein said second solder layer is deposited directly on said first solder layer, so as to form a two-layer solder joint.

* * * * *